US012684739B2

(12) United States Patent
Ganju et al.

(10) Patent No.: US 12,684,739 B2
(45) Date of Patent: Jul. 14, 2026

(54) SYSTEM AND METHOD FOR RADIATIVE COOLING FOR DATA CENTERS

(71) Applicant: Mellanox Technologies Ltd., Yokneam (IL)

(72) Inventors: Siddha Ganju, Santa Clara, CA (US); Elad Mentovich, Tel Aviv (IL); Tahir Cader, Spokane Valley, WA (US); Nyla Worker, San Francisco, CA (US)

(73) Assignee: Mellanox Technologies, Ltd., Yokneam (IL)

( * ) Notice: Subject to any disclaimer, the term of this patent is extended or adjusted under 35 U.S.C. 154(b) by 574 days.

(21) Appl. No.: 17/935,511

(22) Filed: Sep. 26, 2022

(65) Prior Publication Data

US 2023/0413494 A1 Dec. 21, 2023

Related U.S. Application Data

(60) Provisional application No. 63/352,250, filed on Jun. 15, 2022.

(51) Int. Cl.
*H05K 7/20* (2006.01)
*G05B 19/4155* (2006.01)

(52) U.S. Cl.
CPC ..... *H05K 7/20836* (2013.01); *G05B 19/4155* (2013.01); *H05K 7/20263* (2013.01); *H05K 7/2079* (2013.01); *G05B 2219/49216* (2013.01)

(58) Field of Classification Search
CPC ..... G01W 1/10; G01W 1/00; G01W 2203/00; G02F 1/13312; G02F 1/133553; G02F 1/137; G02F 1/153; G05B 15/02; G05B 2219/2642; G05B 19/042; E06B 2009/2417; F25B 23/003; F25B 25/005;
(Continued)

(56) References Cited

U.S. PATENT DOCUMENTS 6,314,631 B1 * 11/2001 Pryor ........................ B62D 1/28
29/407.04
2011/0179791 A1 * 7/2011 Butler ..................... F24S 50/00
126/684
(Continued)

OTHER PUBLICATIONS

Lee, J.-Y, et al., Enhanced Heat-Electric Conversion via Photonic-Assisted Radiative Cooling [online]. Nanomaterials, Nov. 2021, 983. Retrieved from the Internet <doi.org/10.3390/nano11040983>.
(Continued)

*Primary Examiner* — Darrin D Dunn
(74) *Attorney, Agent, or Firm* — Alston & Bird LLP

(57) ABSTRACT

Methods, apparatuses, systems, computing devices, and/or the like are provided. An example system for heat dissipation may include a memory. The example system may also include a processor configured to receive at least one visual representation of at least a portion of the sky, determine, based on the at least one visual representation (e.g., using artificial intelligence), a mask distinguishing between clouded and cloudless portions of the sky, based on the mask, determine a direction in which to point a heat dissipation panel toward one or more aim portions of the sky, and generate a signal to cause one or more heat dissipation surfaces or panels to be moved (e.g., using a robotic arm) such that heat is radiated toward the one or more aim portions of the sky.

18 Claims, 6 Drawing Sheets

(58) Field of Classification Search
CPC ........ F25B 19/00; F25B 49/025; F25B 39/02;
F28F 13/18; F28F 2245/06; F28F 23/00;
F24F 2130/20; F24F 5/0046; F24F
2140/20; F24F 2140/00; F24F 1/14;
G06T 2207/30192; G06T 7/70; G06T
2207/10016; G06T 2207/20084; Y02B
30/54
See application file for complete search history.

(56) References Cited

U.S. PATENT DOCUMENTS

| | | | | |
|---|---|---|---|---|
| 2011/0240007 | A1* | 10/2011 | Currier | F24S 50/00 |
| | | | | 126/606 |
| 2011/0247348 | A1* | 10/2011 | Mashiko | F28D 20/021 |
| | | | | 62/62 |
| 2012/0078424 | A1* | 3/2012 | Raghavachari | G05B 15/02 |
| | | | | 700/282 |
| 2012/0180979 | A1* | 7/2012 | Harrington | H05K 7/20272 |
| | | | | 165/96 |
| 2014/0366566 | A1* | 12/2014 | Wei | H05K 7/2079 |
| | | | | 62/259.2 |
| 2015/0134251 | A1* | 5/2015 | Bixel | G01W 1/12 |
| | | | | 700/287 |
| 2018/0047170 | A1* | 2/2018 | Hamann | H04N 25/71 |
| 2018/0232557 | A1* | 8/2018 | Chang | G06T 7/215 |
| 2020/0410640 | A1* | 12/2020 | Yan | G01W 1/10 |
| 2021/0165130 | A1* | 6/2021 | Chang | G06T 7/20 |
| 2021/0219463 | A1* | 7/2021 | Raman | H05K 7/20309 |
| 2021/0398312 | A1* | 12/2021 | Takashima | G06V 10/70 |
| 2023/0075132 | A1* | 3/2023 | Lawrence | F24S 20/61 |
| 2023/0154014 | A1* | 5/2023 | Humann | G06T 7/248 |
| | | | | 382/107 |
| 2023/0336111 | A1* | 10/2023 | Gero | H02S 20/30 |
| 2024/0144488 | A1* | 5/2024 | Humann | G06T 7/11 |
| 2024/0418418 | A1* | 12/2024 | Lu | F28D 21/0015 |

OTHER PUBLICATIONS

Lim, X. "The Super-cool Materials That Send Heat To Space" [online]. Nature 577 (2020). Retrieved from the Internet <www.nature.com/articles/d41586-019-03911-8>.
24/7 Electricity-Free Cooling [online]. Retrieved from the Internet <www.skycoolsystems.com>.
Ganju et al., pending U.S. Appl. No. 63/352,250, filed Jun. 15, 2022.
Mohr et al., pending U.S. Appl. No. 17/879,620, filed Aug. 2, 2022.
Ruso et al., pending U.S. Appl. No. 17/892,283, filed Aug. 22, 2022.
Ruso et al., pending U.S. Appl. No. 17/968,447, filed Oct. 18, 2022.
Cader et al., pending U.S. Appl. No. 18/100,296, filed Jan. 23, 2023.
Cader et al., pending U.S. Appl. No. 18/118,958, filed Mar. 8, 2023.

* cited by examiner

300

301

306
Liquid supply

Liquid-cooled computer racks

Radiative panels that are robotically
directed at cloudless skies

Partially cooled water directed at
cooling tower for residual cooling

Cooling tower

305

304

303

302
Liquid return

Valve to direct return flow
through radiative panels, to
the cooling tower, or both

SYSTEM AND METHOD FOR RADIATIVE COOLING FOR DATA CENTERS

This application claims priority to U.S. application Ser. No. 63/352,250, which was filed on Jun. 15, 2022, which is hereby incorporated by reference.

FIELD OF THE DISCLOSURE

The present disclosure relates to the field of heat dissipation and applies to removing heat from heat emitting devices, e.g., in a computer data center; in some cases, actively moving or orienting heat dissipating or reflecting device.

BACKGROUND

Computing devices such as graphics processing units (GPUs) or other computing devices such as central processing units (CPUs) when arranged in substantial numbers, such as in data centers, generate tremendous amounts of heat. Such heat may affect the functionality and the useful life of the components. For effective operation of such computing devices, this heat is dissipated. Heat may be dissipated through cooling by, for example, using liquid cooling, external cooling, fans, corridor cooling and the like. Such mechanisms may be energy intensive and have a negative impact on the environment.

Radiative cooling technology allows heat energy to be converted to electromagnetic or light energy and dispersed into the sky by the use of emissive surfaces, which may also be reflective. Liquid containing waste heat from equipment may be pumped through the panels, which then emit the heat via electromagnetic energy, infrared light or light within a wavelength range of for example 8-13 which then may penetrate the atmosphere and thereby scatter the heat energy from the equipment into the upper atmosphere or into space. Such radiative cooling is most effective when such light is not encumbered by or absorbed by clouds. Thus, when cloud coverage is minimal or non-existent, energy may directly escape the atmosphere. Such techniques are most useful in geographic areas where cloud coverage is traditionally low such as, but not limited to, Israel and California, but may be less effective in areas with traditionally heavy cloud cover such as Alaska.

SUMMARY

A system for heat dissipation may receive an image of the sky, determine a cloudless portion of the sky, e.g., using artificial intelligence; and generate a signal to cause a heat dissipation surface or panel to be moved (e.g., using a robotic arm) such that heat is radiated toward the cloudless portion of the sky. The heat dissipation surface or panel, e.g., a passive cooling panel, may emit electromagnetic energy and cool liquid flowing through the panel. The liquid may be used to cool heat generating components such as GPUs.

In various embodiments, a system for heat dissipation is provided. In some embodiments, the system may include a memory. In other embodiments, the system may include a processor configured to receive one or more images of at least a portion of the sky. In some embodiments, the processor may be configured to determine, based at least in part on the one or more images of at least a portion of the sky, if there exists one or more aim portions of the sky. In some embodiments, the processor may be configured to generate a signal to cause one or more heat dissipation surfaces to be moved such that heat is radiated toward the one or more aim portions of the sky.

In some embodiments, the system for heat dissipation may include a camera. In some embodiments, the camera may be configured to capture one or more images of the sky, the one or more images of the sky being received by the processor.

In some embodiments, the signal may be transmitted to a robotic arm.

In some embodiments, the processor may be further configured to employ artificial intelligence to determine if there exists the one or more aim portions of the sky, wherein the one or more aim portions of the sky are selected from a group consisting of: one or more portions in the one or more images of the at least a portion of the sky where the sky is cloudless or thinly clouded; one or more portions in the one or more images of the at least a portion of the sky that require a minimum of movement from one or more heat dissipation surfaces; and one or more portions in the one or more images of the at least a portion of the sky that are more likely than other portions of the sky to remain cloudless or thinly clouded.

In some embodiments, the processor may be further configured to determine whether to perform radiative cooling using the one or more heat dissipation surfaces, to perform active liquid cooling using a cooling tower, or to perform a combination of radiative cooling and active liquid cooling using the one or more heat dissipation surfaces and the cooling tower, respectively.

In some embodiments, the one or more heat dissipation surfaces may include one or more passive cooling panels configured to emit electromagnetic energy and to cool liquid flowing through the one or more passive cooling panels.

In some embodiments, the heat dissipation surface may be configured to cool liquid that is circulated through a heat-producing component to cool the heat-producing component.

In various embodiments, a method for heat dissipation is provided. In some embodiments, the method may include receiving, at a computer processor, one or more images of at least a portion of the sky. In some embodiments, the method may include determining, by the computer processor, if there exists one or more aim portions of the sky, based in part on the one or more images of at least a portion of the sky. In some embodiments, if there exists the one or more aim portions of the sky, the method may include generating, by the computer processor, a signal to cause one or more heat dissipation surfaces to be moved such that heat is radiated toward the one or more aim portions of the sky.

In some embodiments, the signal may be transmitted to a robotic arm.

In some embodiments, the method may include using artificial intelligence to determine if there exists the one or more aim portions of the sky, wherein the one or more aim portions are selected from a group consisting of: one or more portions in the one or more images of the at least a portion of the sky where the sky is cloudless or thinly clouded; one or more portions in the one or more images of the at least a portion of the sky that require a minimum of movement from one or more heat dissipation surfaces; and one or more portions in the one or more images of the at least a portion of the sky that are more likely than other portions of the sky to remain cloudless or thinly clouded.

In some embodiments, the processor may be further configured to determine whether to perform radiative cooling using the one or more heat dissipation surfaces, to perform active liquid cooling using a cooling tower, or to perform a combination of radiative cooling and active liquid cooling using the one or more heat dissipation surfaces and the cooling tower, respectively.

In some embodiments, the one or more heat dissipation surfaces may include one or more passive cooling panels configured to emit electromagnetic energy and to cool liquid flowing through the one or more passive cooling panels.

In some embodiments, the heat dissipation surface may be configured to cool liquid that is circulating through a heat-producing component to cool the heat-producing component.

In various embodiments, a system for heat dissipation is provided. In some embodiments, the system may include a memory. In some embodiments, the system may include a processor configured to receive at least one visual representation of at least a portion of sky. In some embodiments, the processor may be configured to determine, based on the at least one visual representation of the at least a portion of sky, a mask distinguishing between clouded and cloudless portions of the sky. In some embodiments, the processor may be configured to, based on the mask, determine a direction in which to point one or more heat dissipation panels toward one or more aim portions of the sky, if there exists the one or more aim portions of the sky. In some embodiments, the processor may be configured to generate a signal to cause the one or more heat dissipation panels to move to point toward the one or more aim portions of the sky.

In some embodiments, the determination of a direction may be used to move one or more actuators moving the one or more heat dissipation panels.

In some embodiments, the mask may be determined using a neural network.

In some embodiments, the processor may be further configured to determine whether to perform radiative cooling using the one or more heat dissipation surfaces, to perform active liquid cooling using a cooling tower, or to perform a combination of radiative cooling and active liquid cooling using the one or more heat dissipation surfaces and the cooling tower, respectively.

In some embodiments, the system may include a valve configured to selectively direct cooling fluid to one or more of the one or more heat dissipation panels and a cooling tower.

In some embodiments, the one or more heat dissipation panels may include one or more passive cooling panels configured to emit electromagnetic energy and to cool fluid flowing through the one or more panels.

In some embodiments, the one or more heat dissipation panels may be configured to cool liquid that is circulating through a heat-producing component to cool the heat-producing component.

BRIEF DESCRIPTION OF THE DRAWINGS

The subject matter regarded as the disclosure is particularly pointed out and distinctly claimed in the concluding portion of the specification. The disclosure, however, both as to organization and method of operation, together with objects, features, and advantages thereof, may best be understood by reference to the following detailed description when read with the accompanying drawings in which:

DETAILED DESCRIPTION

Figure 1A:
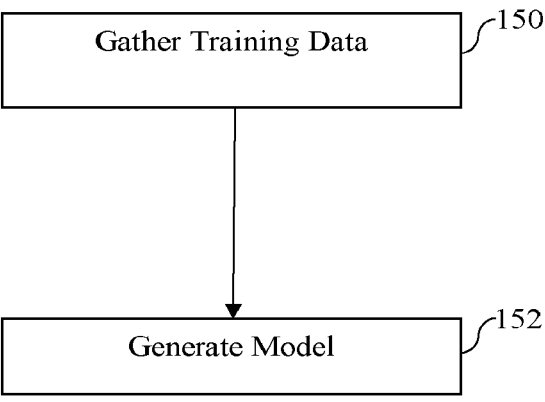
FIG. 1A presents a flow chart of a first example method, according to some embodiments of the disclosure.

In the following detailed description, numerous specific details are set forth in order to provide a thorough understanding of the disclosure. However, it will be understood by those skilled in the art that the present disclosure may be practiced without these specific details. In other instances, well-known methods, procedures, and components have not been described in detail so as not to obscure the present disclosure. Some features or elements described with respect to one embodiment may be combined with features or elements described with respect to other embodiments. For the sake of clarity, discussion of same or similar features or elements may not be repeated.

Although embodiments of the disclosure are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing embodiment, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes. Although embodiments of the disclosure are not limited in this regard, the terms "plurality" and "a plurality" as used herein may include, for example, "multiple" or "two or more".

The terms "plurality" or "a plurality" may be used throughout the specification to describe two or more components, embodiments, elements, units, parameters, or the like. The term set when used herein may include one or more items. Unless explicitly stated, the method embodiments described herein are not constrained to a particular order or sequence. Additionally, some of the described method embodiments or elements thereof can occur or be performed simultaneously, at the same point in time, or concurrently.

While certain features of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the disclosure. Further, specific features of certain embodiments may be used as features with other embodiments.

Embodiments may allow for determining the location of current cloudless portions in the sky and directing radiative cooling devices at those areas. In some embodiments, the time between identifying a cloudless sky portion and directing one or more radiative cooling devices to be directed to one or more portions of cloudless sky (e.g., beginning the movement of the radiative cooling device toward the cloudless sky portion) may be brief. In some embodiments, this time may be less than 1 second, more specifically less than 500 msec, and even more specifically, less than 200 msec. Artificial intelligence (AI) or machine learning (ML) may be used to determine current cloud coverage and identify cloudless portions of the sky to direct and dissipate energy toward a cloudless area of the sky. In other embodiments, instead of ML or AI techniques, images of the sky may be used by algorithmic methods to determine the location of clouds. Embodiments may then automatically position (direct an emissive surface of) a passive radiative cooling device toward zero or low cloud coverage locations using a robotic arm or other device that affords a change in angle. Heat may be converted into light or other electromagnetic radiation to dissipate the heat by radiating the energy into the portion of the sky in which cloud cover is not present. The presence of cloud cover in the atmosphere may be ascertained through photographs, satellite data, or by monitoring cloud cover in real-time. This data may then be used as input to, for example, an artificial intelligence model to forecast the presence or absence of cloud cover in the future. Based upon such determinations, heat dissipation technology may then be directed/turned to emit heat toward the cloudless portions of the sky and the energy dispensed into the cloudless portion of the sky. Embodiments may use artificial intelligence or other techniques to determine current cloud coverage and lack thereof by analyzing photographs and satellite imagery of the sky. An emissive surface may be aimed at, turned, or otherwise moved to face toward one of the identified cloudless portions e.g., through a robotic arm, that affords change in an angle of the heat radiative surface, or the direction in which it is pointing (e.g., defined by multiple angles). Such determinations may also be used to reposition the emissive surface when cloud conditions change. In some embodiments, artificial intelligence or other techniques may be configured to detect different cloud thickness and direct the emissive surface toward an area of sky with the least cloud coverage or the area of sky where the most heat may be emitted. In some embodiments, this portion may be one or more aim portions for the emissive surfaces.

An emissive surface or heat dissipation surface may be for example a panel, for example positioned on the roof of the facility requiring cooling, or positioned elsewhere. An example of such a surface or panel may use liquid (e.g., water, or other suitable liquid or fluid) flowing internally through the panel to dissipate waste heat to be emitted through an emissive surface of the panel. Heat from the heat producing components (e.g., GPUs, CPUs) in a data center or other context may be transferred to liquid or fluid (e.g., water) through known methods, the fluid or liquid may be passed or pumped through the radiative panels, which may then reject the heat into a portion of a cloudless sky (as the surface of the radiative panel is pointed toward the cloudless portion of the sky), cooling the fluid or liquid, which is recirculated through heat producing components to cool them. Other heat producing components, such as washing machines or clothes dryers, may also be cooled using embodiments of the present disclosure. Any of a variety of heat emitting devices or panels may be used. The panels or surfaces may cool liquid circulating through heat-producing components to cool the heat-producing components. Such panels may include a dual-mode film or coating to the top surface of each panel which may reflect sunlight to prevent the panels from heating up during the day, and also emit infrared heat to the cold sky, which may cool the panels and thus any fluid flowing through them. In one embodiment, a panel's temperature may drop by e.g., 15° F. below the ambient temperature, cooling the fluid within the panel. A panel may be used with an emissive and/or reflective coating thereon. Some embodiments may work on a small scale. For example, a "sticker" or small compute job may be used with a GPU determining where to aim a panel, and the panel may be moved using a small motor operated by a small, e.g., coin-sized battery.

Embodiments may combine heat energy from multiple sources, e.g., multiple GPUs or CPUs, into one emissive (e.g., infrared or light) source or multiple light sources, such as heat dissipation surfaces.

Figure 5:
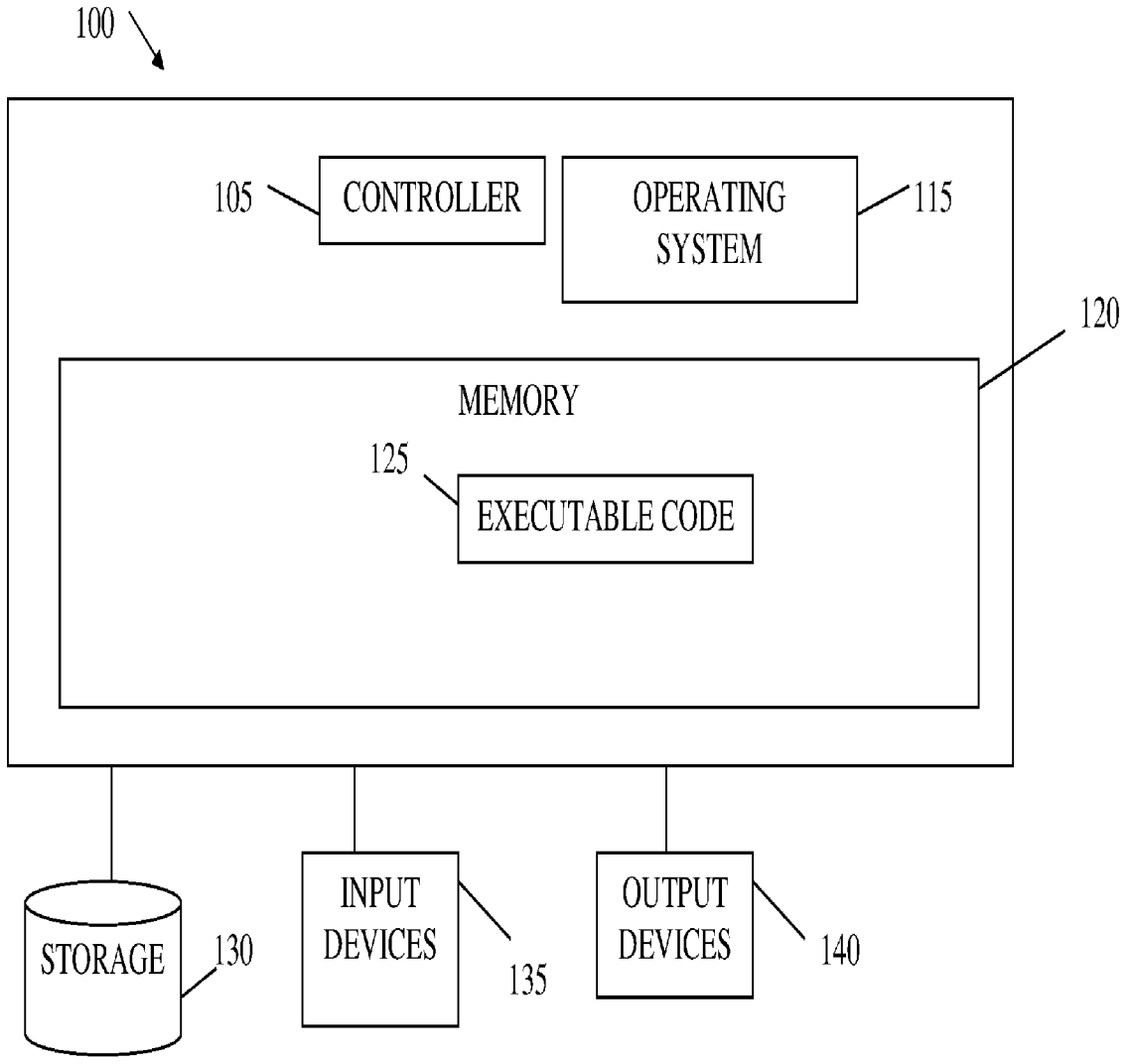
FIG. 5 shows a high-level block diagram of an exemplary computing device which may be used with embodiments of the disclosure.

In one embodiment, clear sky or cloudless sky determination may be carried out, and then a heat emitting device or panel, e.g., with a heat emissive surface, may be accordingly moved (e.g., tilted, turned, and/or the like) or repositioned; e.g., the angles of the surface may be altered (while typically the location of the surface is not moved). One embodiment includes, for example, two separate modules. Such modules may be embodied by or executed by a computer system for example as shown in FIG. 5. While two modules are described, functionality from these modules may be performed by one or another number of modules. A first module (e.g., cloud coverage determination module) may determine cloudless portions. For example, a first module may include an artificial intelligence module (e.g., trained using information documenting past cloudy and cloudless sky conditions), receive input such as current photographic or satellite images data of the sky, and produce as output current cloud coverage information, incorporating the geographic location of the sky that is imaged. This data may be input and processed through modules such as the DeepLab semantic segmentation mode, which produces dense predictions by up-sampling the output of the last convolution layer and computing pixel-wise loss. Input may also be processed through U-Net, which is a convolutional neural network (NN) developed for biomedical image segmentation, or a DeepLab NN. Other AI or ML systems may be used, and determining cloud coverage may be performed using systems other than AI and ML. In some embodiments, other segmentation networks such as resnet, inception, resnext, and/or VGG may be used. The output of an AI or ML model may be a segmentation mask of sky with no clouds, e.g., an image with each pixel being 0 or 1, zero indicating a cloud and 1 indicating a cloudless portion (other segmentation masks may use different numbers of values depending on the number of classes to segment). The segmentation mask or other output may be converted to 3D coordinates or angles, e.g., X, Y and height, which may be an aim point or target for a radiative cooling device; from this aim point a direction or angle for the radiative cooling device may be determined, and the cooling device positioned accordingly. In some embodiments, the segment mask or other output may be converted to ranges of 3D coordinates or angles, which may be one or more aim portions for one or more radiative cooling devices; from these one or more aim portions, one or more directions or angles for one or more radiative cooling devices may be determines, and one or more cooling devices may be positioned accordingly.

AI or ML in some embodiments may perform cloud segmentation. Data processing other than AI may be used to identify cloudless portions of the sky, e.g., identifying pixels based on a pixel value of red, green and blue (RGB) or another type of image input, which may be less expensive than artificial intelligence-based segmentation (typically such non-AI methods may be effective when the sky is blue and not hazy, misty, etc.). In some embodiments, AI may be used to identify portions of the sky that are likely to remain cloudless for longer periods of time than other portions (for example, in instances where the clouds are moving. In other embodiments, AI may be used to determine one or more aim portions that require the least movement of one or more panels to reach the one or more aim portions to dissipate heat. In further embodiments, AI may be used to find the "centers" of these one or more aim portions for directing one or more panels to reach the "centers" of these one or more aim portions to dissipate heat; the "center" may be a coordinate point of the respective aim portion. It will be understood that aim portions may be determined by the AI based on a variety of criteria.

Output from a first module, such as a map of cloudless (or thinly clouded) portions, or a segmentation mask, may then be converted into coordinates (e.g., geometric positioning parameters) for determining where heat dissipating structures or surfaces should be positioned or aimed, such as three-dimensional coordinates comprising an X dimension, a Y dimension, and a height or altitude. Such information may then be used to derive a specific aim point for passive radiative cooling or heat dissipation surfaces. The specific aim point may then be utilized to turn, shift, tilt, or otherwise reposition the heat dissipating structures such that an emissive surface thereof is pointed toward the aim point. In some embodiments, the specific aim point may be a cloudless or thinly clouded portion of the sky. In other embodiments, an aim portion may be determined, which may include a range of coordinates. In some embodiments, if the heat dissipating structures are "correctly" positioned to be currently pointing near or close to a cloudless portion output by the first module, no movement may be needed.

In one embodiment, the latitude and longitude, or other representation of position, of the camera or imager which provided input resulting in the output depiction of cloudy and cloudless portions, e.g., in a segmentation mask, is known. The direction the camera or imager is facing, e.g., the point of view, is also known. From this it can be computed the Earth-relative coordinates of the cloud or cloudless portions of the image. From this the ecliptic or sun centered coordinates may be calculated. Known methods can convert the Earth-relative coordinates to. for example. coordinates in an ecliptic coordinate system or other celestial coordinate system, to represent, relative to the imager, the apparent position of a desired (e.g., cloudless) portion of the output depiction or segmentation mask (i.e., one or more potential aim portions). It may be assumed that the position of the heat emitting panels and movement apparatus are effectively the same as that of the imager or camera. The ecliptic coordinate system may use as an origin the center of either the Sun or Earth, have a primary direction toward the vernal (March) equinox, and have a right-hand convention; it may be implemented in spherical or rectangular coordinates. From the ecliptic coordinates or other celestial coordinates, which specify the point in space or sky where the panel is to point, Riemann geometry may be used to provide these coordinates to a movement device (e.g., robotic arm) to determine where and how to move the panel such that the electromagnetic radiation emitted is aimed toward the given coordinates. This may be for example the equation of a straight line. Such computations may be performed using, e.g., computing system 230 of FIG. 2.

In other embodiments reinforcement learning (RL) may be used. For example, simulated data may be used to iteratively train a RL model in a simulated environment, and that trained RL model may be used to identify cloudy and cloudless portions in newly seen images. In another embodiment, image analysis using AI such as a NN may be omitted, and an RL algorithm may control movement of an emissive or dissipating surface, with feedback telling the RL algorithm if the surface is in fact pointing at a (typically desired) cloudless portion. In one embodiment a RL model can learn a reward function using simulated images. In this manner the RL algorithm may, using a reward function (e.g., more reward for moving the panel to face a cloudless portion; and/or more reward for moving to a portion of the sky cloudless enough to maximize the time until future panel movement is needed—it will be understood that either one of these examples may be one or more aim portions) learn to move the surface to a cloudless portion (i.e., one or more aim portions). This may avoid large scale data collection and the training of a NN model. Reinforcement learning training may use segmenting and other techniques to optimize rewards such as how long a patch of sky remains empty and without clouds so that minimum movement of emissive surfaces is required. Off-line RL training may be performed using simulated inputs representing the sky. Example RL models used may include Deep Q-Network (DQN) and deep deterministic policy gradient (DDPG).

A second module (e.g., movement generation module) uses, e.g., software to determine the direction in which to align the position of a passive radiative or heat dissipation surface to ensure electromagnetic radiation (e.g., infrared, light, etc.) reaches the cloudless portion of the sky. This module may employ motors, servos or a robotic arm to change the angle or other position of the passive radiative cooling device or emissive surface to strike (i.e., point in the direction of) the aim point. Such a servo or arm may receive as input instructions as to how much to move and where to position the emissive surface based on the specific coordinates generated from post-processing the outputs from the first module.

Figure 1B:
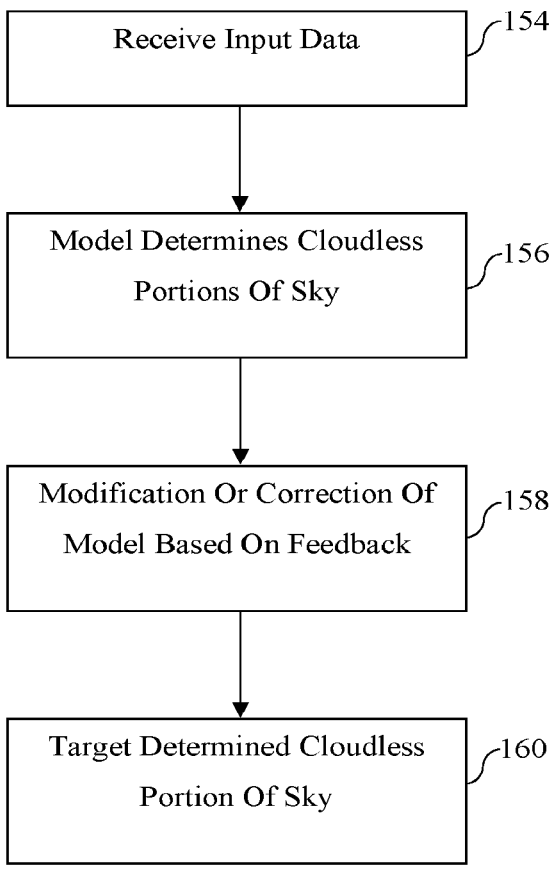
FIG. 1B presents a flow chart of a second example method, according to some embodiments of the disclosure.

FIGS. 1A and 1B present example methods according to some embodiments of the disclosure. The operations of FIGS. 1A and 1B may be performed with equipment such as in FIGS. 2, 3 and 5, but may be performed using other equipment. Referring to FIG. 1A, in operation 150 training data may be gathered. For example, historical image data descriptive of cloud cover related to a specific geographic area may be used. This data can be gathered for example from archival sources such as photographic evidence, satellite images such as Sentinel 1 and Sentinel 2 satellite image data, National Oceanic and Atmospheric Administration (NOAA) data, weather forecasting data and the like. Other training data may be used. In operation 152 a model or algorithm may be created, trained or generated to identify a cloudless portion of the sky based on the received historical image data. For example, past or historical sky cover image data may be used to train an ML or NN algorithm (e.g., a U-net NN or another NN) in a simulated environment. Training may be performed using, e.g., the Keras or PyTorch training methods. In other embodiments an RL algorithm may be trained using historical or simulated data.

Referring to FIG. 1B, in operation 154 input data may be received. For example, as a visual representation of the sky, current or real-time cloud cover image data obtained through monitoring cloud cover conditions in a geographical area may be received, e.g., from an imager located at the site where cooling is desired. That is, the imager may take images from a known location and/or at a known perspective. This reference data (i.e., location and perspective) may be included in the input data. In some embodiments, triangulation methods may be used to further confirm a location. Input data may be normalized to training data: for example, input data may be converted into a RGB or a pixel-based format comparable to the historical data. In one embodiment, an imager used may be a commonly available imager producing e.g., RGB images. In operation 156, the model or algorithm may determine which portion or portions of the sky are currently cloudless. In some embodiments, the model or algorithm may determine or identify this portion or these portions as an aim point or aim points. In other embodiments, the model or algorithm may determine which portion or portions of the sky are thinly clouded and then determine or identify them as an aim point or aim points. It will be understood that the location of the portions of the sky that are currently cloudless (or thinly clouded) are determined from the perspective and/or location of the imager and/or based on the input images. For example, a mask representing cloudless and/or cloudy portions of the sky may be output. In some cases, in operation 158 iterative modification may be performed on the model or algorithm based on the real-time cloud cover data in combination with feedback determining if the algorithm's output is correct; this may improve the model over time. In some embodiments, imaging and data processing can be done in a tiled manner, with several imagers, each aimed at a specific region of interest in the sky; the multiple images may be used by an algorithm as with images from one camera. It will be understood that the imagers each take images having a known location and perspective. Methods used to track clouds may be similar to methods for object tracking across a video across multiple cameras, e.g., for security. In operation 160 a determined cloudless portion of the sky is targeted as an aim point and the heat dissipation apparatus is positioned to direct light energy toward a determined current cloudless portion of the sky. In some embodiments, this positioning may be based on the location and perspective of the images taken by the imagers and/or the location and orientation of the heat dissipation apparatus or apparatuses. In some embodiments, the portion of the sky that provides maximum efficiency as a cloudless aim portion. For example, based on an output mask, a direction in which to point a heat dissipating panel may be determined. While typically aiming one or more panels toward and emitting energy at cloudless portions provides the most benefits, aiming at cloud-covered portions may still take heat away from components, albeit not the most efficiently. For example, in some embodiments, a cloud-covered portion may be determined by AI to be a portion that requires less movement of one or more panels, thereby speeding the time to emitting heat and potentially emitting more heat. It will be understood that, in some embodiments, multiple heat emitting surfaces may be directed to a single aim portion, while, in other embodiments, each heat emitting surface of one or more heat surfaces may be directed to one or more respective aim portion (i.e., one heat emitting surface for one aim portion). An embodiment may determine, from a determination of cloudless and cloudy portions, the efficiency of emissive panel heat removal, compare this to other methods such as a cooling tower, and choose the best method for cooling. The heat dissipation apparatus may include a passive cooling panel receiving fluid or liquid from heat producing devices, to emit electromagnetic energy and to cool liquid flowing through the panel; the cooled liquid being pumped back to cool the heat producing devices. For example, a signal may be generated to cause a heat dissipation surface to be moved such that heat is radiated toward a cloudless or low-cloud portion of the sky.

In other embodiments, data other than cloud cover data or image data may be used; e.g., parameters or data regarding the environment external to a heat producing device or to a data center may be input. Based on such parameters or data, a signal may be generated to cause a heat dissipation surface radiating heat generated by the heat producing device to be moved.

Figure 2:
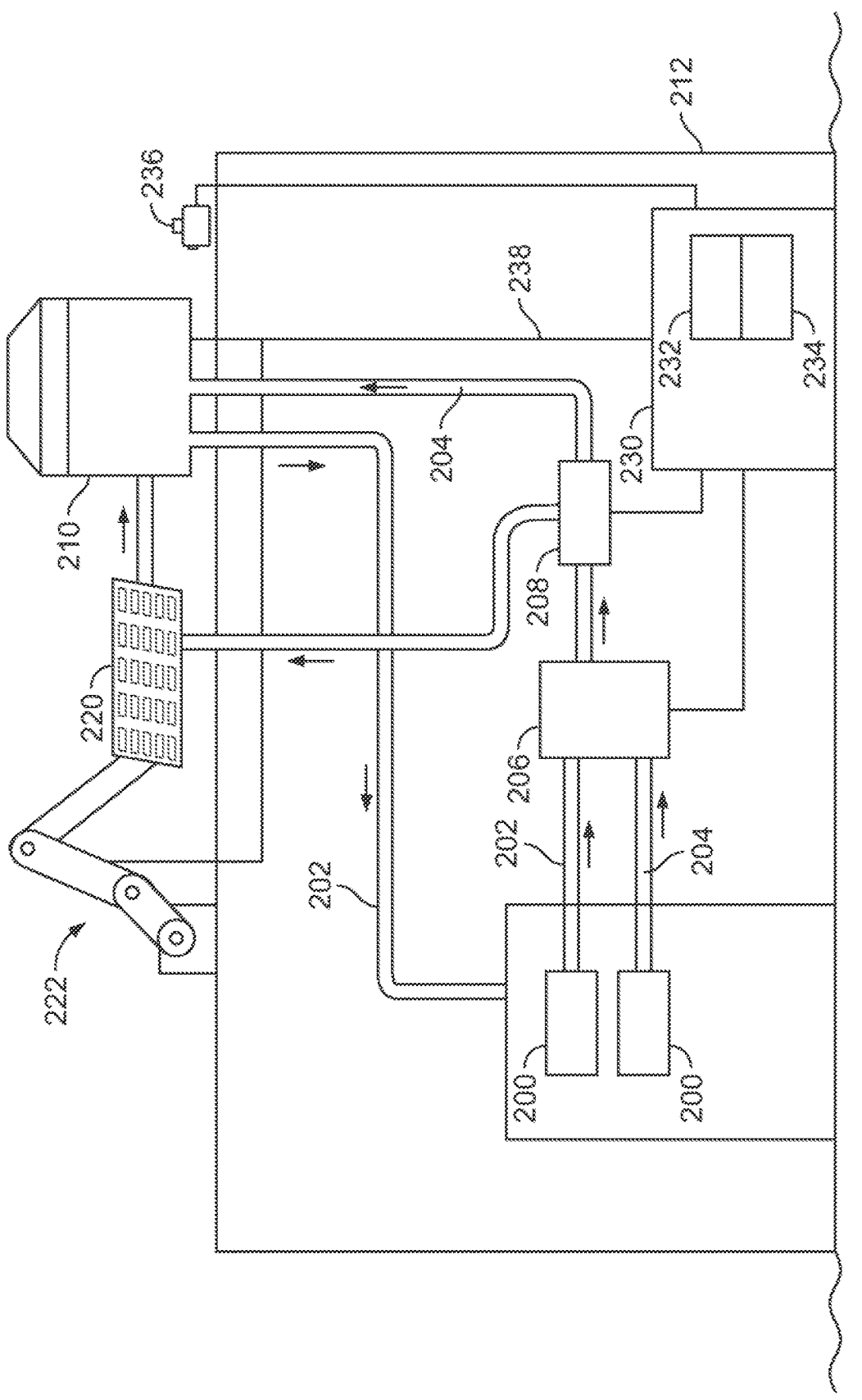
FIG. 2 presents an illustration of radiative cooling, according to some embodiments of the disclosure.

FIG. 2 presents an illustration of adaptive and radiative cooling implemented in a data center according to some embodiments of the disclosure. Heat generating components, e.g., GPUs or other processors 200 (e.g., contained in the liquid-cooled computer racks) produce heat transferred to pipes 202 containing fluid or liquid (e.g., cooling water 204), which is then transported, e.g., by pumping systems 206 to one or more valve(s) 208 such as three-way valves which may selectively control (e.g., direct fluid) whether fluid or liquid is cooled by being directed to a cooling tower 210 (e.g., active liquid cooling using energy to cause cooling, as with air conditioning or heat exchanging systems), to heat radiating devices or panels 220, or both. One or more panels 220 may be used. In one embodiment, an array of radiative cooling panels 220 may be distributed across an area (e.g., in different places around a data center, e.g., on the roof of or in another area), and a controller may position each accordingly to aim toward different points in the sky. In addition, a number of imagers may be used taking inputs and each outputting (via a controller) to its own corresponding panel, individually. Fluid may flow from panels 220 to cooling tower 210, and from cooling tower 210 back to heat producing devices 222. Panels 220 may be located on the roof of facility or building 212 housing heat generating components 200 or elsewhere. Panels 220 may be attached to or held by movement devices 222 such as actuators, motors, a movable mechanical device or support mount, or robotic arms. While only one heat generating component 200, panel 220 and movement devices 222, and other components, are shown, multiple such components may be used. A computer system 230 may include a cloud coverage determination module 232 and a movement generation module 234 and may be implemented by components such as in FIG. 5. Computer system 230 may decide whether or in what proportion to use passive radiative cooling or active cooling, e.g., via valve(s) 208 or another component; e.g., computer system 230 may decide, in an "adaptive", mode in what proportions to route hot coolant fluid through panels 220 or active cooling systems such as cooling tower 210. Such a decision may be made, e.g., based on a "condition check", for example determining what portion of the sky is cloudy, and thus how efficient emissive cooling from panels is, and based on such input data which method is more efficient; as another example, determining what portion of the sky requires a minimum amount of movement of the one or more panels to be directed toward. Computer system 230 may take input as historical data; image data from external sources as discussed herein; and/or from an on-site or other camera 236. Various components may be connected by control lines 238. Computer system 230 may produce output to cause movement devices 222 to move or adjust the position of heat radiating devices or panels 220 as discussed herein.

In one embodiment, an adaptive process may choose among different heat dissipating options. For example, a temperature threshold for cooling water returned to heat producing elements may be set at 32 degrees C. Such a threshold may be configurable or changeable; for example, in the winter, when cooling towers may reject more heat, the threshold may be 20 degrees C. An algorithm as discussed elsewhere herein may determine the state of the sky (e.g., outputting a segmentation mask), and then may calculate the amount of heat that can be rejected to the sky using the available (e.g., installed) emissive panels. For example, it may be known based on the emissive panels and the segmentation mask that 3 MW of heat may be rejected to the sky, out of a total of 10 MW for the total heat rejection that is needed. A process may then direct X % of water or other fluid through the emissive or radiative panels, and the remainder of the heat may bypass the radiative panels (e.g., through the use of a valve) and go directly to the cooling towers. The X % of water leaving the radiative panels may then be delivered to the cooling towers. The two flow streams leaving the cooling tower may leave at for example 32 degrees C. If the sky is completely cloud free, it is possible that 100% of the water would be routed through the radiative panels. If the sky is completely cloudy, and thus that the radiative panels would not reject much heat at all (i.e., a negligible amount of heat), a process may decide to completely bypass the radiative panels, sending all cooling fluid directly to the cooling towers. The water leaving the cooling towers may still be 32 C.

Figure 3:
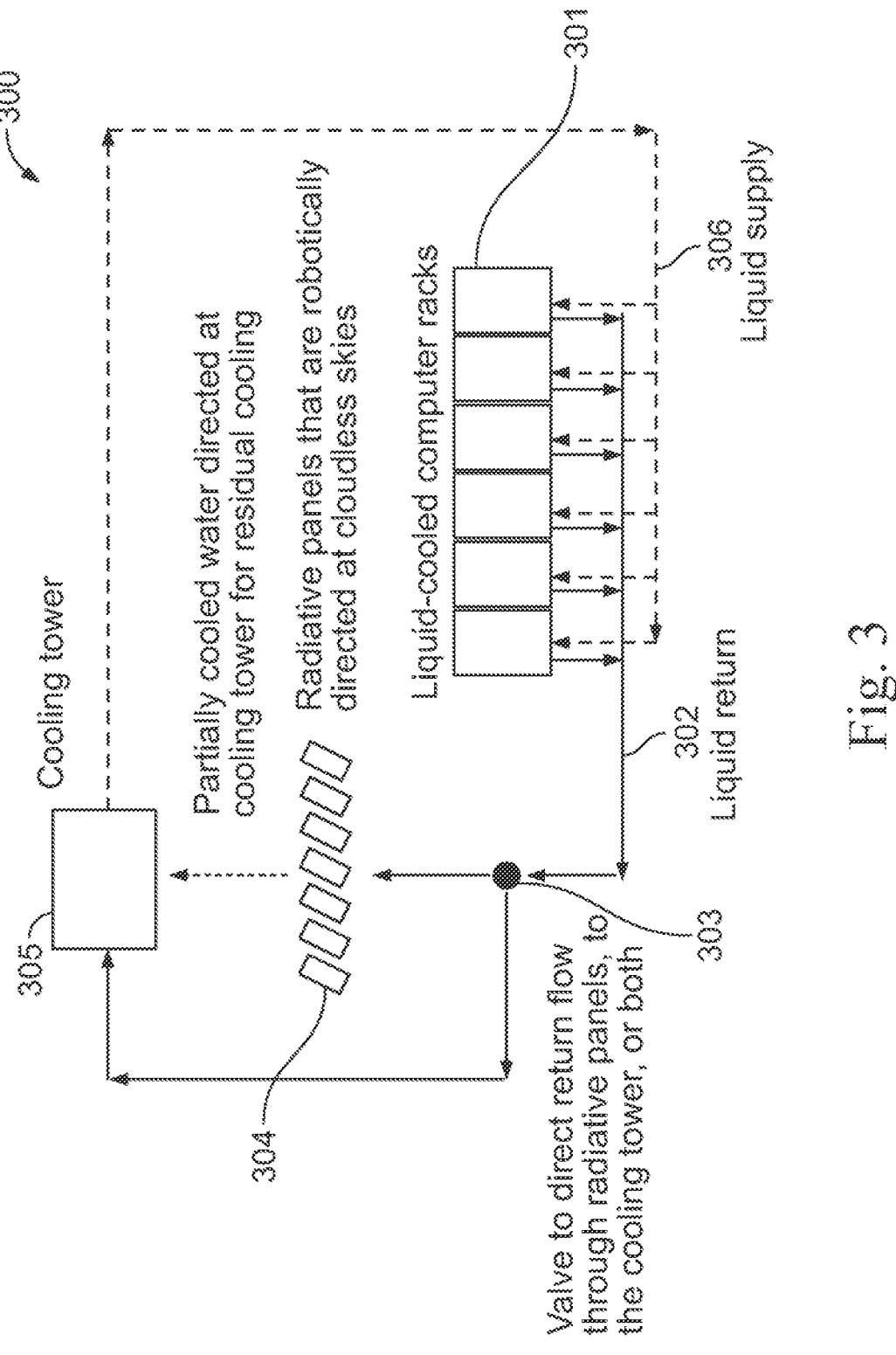
FIG. 3 presents an example schematic of radiative cooling implemented in a data center according to some embodiments of the disclosure.

FIG. 3 presents another schematic illustration of one embodiment 300 of the radiative cooling arrangement of a data center; components in FIG. 3 may have similar function to analogous components in FIG. 2. Heat producing components, e.g., contained in liquid cooled computer racks 301 may be connected to a liquid return 302. Liquid may be pumped throughout the system which carries heated coolant from heat producing components to a valve 303 to direct return flow through at least one of radiative panels 304 or to the cooling towers 305. The coolant in a contained system such that the coolant returns as a liquid supply 306 to the computer racks (e.g., liquid cooled racks 301 or components).

such as CloudSegNet, a deep network for handling 24-hour day and night cloud image segmentation (e.g., nychthemeron cloud image segmentation). Other segmentation networks such as but not limited to Deeplab or U-net NNs may also be employed, as may other non-AI cloud detection tools. In operation 404, based on the output of operation 403, the ascension and declination or elliptic coordinates may be calculated; coordinates may be converted to latitude and longitude coordinates, or other suitable coordinates. A direction in which to move an actuator moving heat dissipating panels may be determined. In operation 404 an actuator 405 such as a robotic arm or gimbal may be moved to orient the direction of the radiative panels toward the desired location in the sky by using the calculated latitude and longitude coordinates. In operation 406, the angle or position of emitting or reflective surfaces may be changed or moved in order to point the emitting surface toward an area of the cloudless sky. Models can be trained using a variety of deep learning Frameworks including Keras, Pytorch, Tensorflow and the like. NN architectures used with embodiments can include architectures such as, U-net, Deeplab and the like. Training data may be labelled data, or input data of sky images where the ground truth are segmentation masks. RL algorithms may be used, such as Deep-Q, and a Deep Deterministic Policy Gradient, an algorithm which concurrently learns a Q-function and a policy. A Deep Deterministic Policy Gradient algorithm may use off-policy data and the Bellman equation to learn a Q-function, and uses the Q-function to learn the policy.

An example of one specific data processing algorithm to normalize input data may be:

```
set width, height = size of image
ratioforresize = 1.0 * input.INPUT_SIZE / max(width, height)
sizeoftarget = (int(ratioforresize * width), int(ratioforresize * height))
resized_image = convertfunction('RGB').resizefunction(sizeoftarget, Image-anti-aliased)
```

Heat dissipation surfaces or radiative panels may at times be capable of dissipating some, most or all waste heat from the racks to outer space. Waste heat unable to be dissipated may be contained in the water leaving the radiative panels may be directed (e.g., by a three-way valve or other system, e.g., controlled by computing system 230 of FIG. 2) to a cooling tower wherein any excess remainder of the heat is removed prior to returning the cooling water back to the liquid-cooled computer racks. In the case of a completely cloudy sky, 100 percent of the liquid may be controlled to bypass the radiative panels and be directed to the cooling tower. Computing system 230 (e.g., using an AI model) may dictate the percentage of the water or other fluid that goes through the radiative panel, and bypasses the radiative panels. When radiative cooling via movable panels is determined to be more efficient, a computing system may decide to perform radiative cooling, and otherwise it may decide to perform normal (e.g., using a cooling tower) liquid cooling of equipment. Cloud cover determined by computing system 230 (e.g., using an AI model) may range from 100 percent cloud-free sky to a 0 percent completely cloudy sky.

Figure 4:
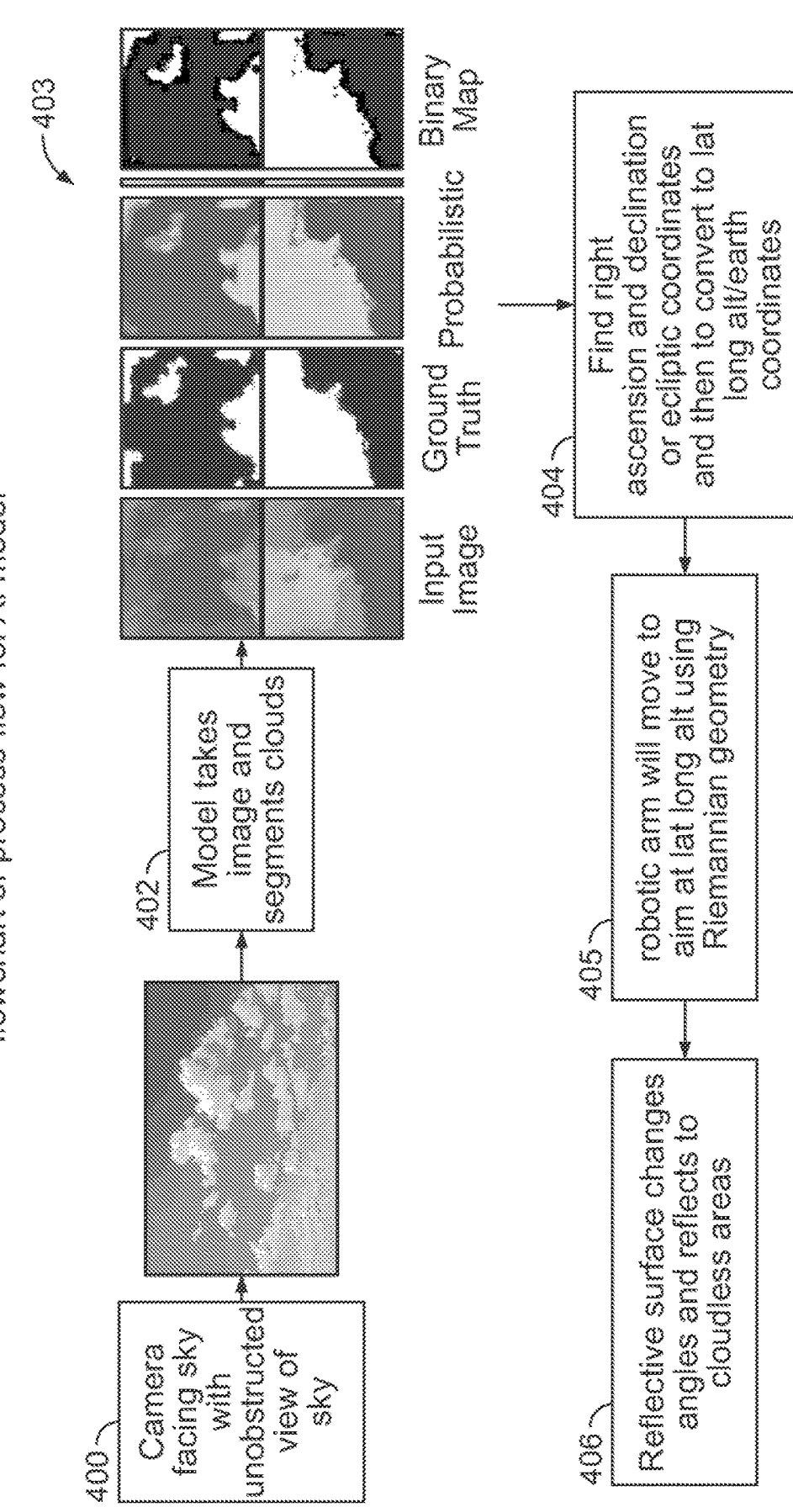
FIG. 4 presents a flowchart of embodiment flow for an artificial intelligence model according to some embodiments of the disclosure.

FIG. 4 presents an example flowchart for the use of an artificial intelligence model e.g., used by computing system 230 in FIG. 2. In operation 400 using a camera pointed or aimed at the sky, images may be obtaining, and the segments of the clouds may be identified (operation 402). In operation 403 a map, e.g., a binary map, may be created by converting the input image to binary data. This may employ a model One example output segmentation map may be:

```
segmentation_map = self.sess.run(
self.OUTPUT_TENSOR,
feed_dict={self.INPUT_TENSOR: [np.asarray(resized_image)]})
seg_map = segmentationmap[0]
return resized_image, segmentationmap
```

One embodiment may receive data from satellite images, such as VV and VH polarization data. This data may be used for training a model, and during inference or model use. Data from satellites such as SAR based satellites (e.g., Sentinel-1 and Sentinel-2) may capture images using polarizations. Co-polarization (VV) and cross-polarization (VH) polarization tile pairs may be used to create an RGB composite image, which may be combined with image channels from satellites, such as from Sentinel-1 C-band SAR imagery.

Processing of this data may use VV and VH polarizations, which may then be converted into RGB data, for example with the following example algorithm:

```
red, _ , _ = Image.open(vv_image_paths[i]).split( )
    red = np.asarray(red)
    _, green, _ = Image.open(vh_image_paths[i]).split( )
    green = np.asarray(green)
    blue = np.abs(red) / np.abs(green)
```

-continued

```
blue = (blue * 255).astype(np.uint8)
rgb = Image.fromarray(np.dstack((red,green,blue)
```

Training data for an ML or NN model used with embodiments herein may take several forms. In one embodiment, the standard RGB image data may be captured from a camera directed toward the sky. Camera input may be normalized or reshaped into the size that the model accepts as input such as the 256×256×3 pixel size. A model formatted in a 256×256×3 pixel input may require little or no image processing, and may enable the model to produce data faster than a camera processing data in real time. Such an embodiment may be less costly because it does not require expensive satellite interaction. Satellite data may be voluminous and thus require large computer processing to clean and validate the data. The ground truth for training may be labelled or tagged image data, or segmented images corresponding to input data.

An alternative embodiment uses previously optimized libraries from commercial sources such as data from the National Oceanic and Atmospheric Administration (NOAA) or from NASA's Moderate Resolution Imaging Spectroradiometer (MODIS) satellites. MODIS measures Earth's large-scale dynamics in a wide bandwidth of wavelengths to allow nuanced measurements of cloud cover and other data with moderate spatial resolution and high temporal resolution.

Other sources of cloud sky data may include instruments and imaging sensors mounted aboard both the Terra and Aqua satellites.

Another embodiment of passive heat removal includes embodiments described herein adapted for a single device, rejecting the heat from a single GPU in a computer workstation or other device via a radiative or emissive panel placed near a window.

FIG. 5 shows a high-level block diagram of an exemplary computing device which may be used with embodiments of the present disclosure. Computing device 100 may include a controller or computer processor 105 that may be, for example, a central processing unit processor (CPU), a chip or any suitable computing device, an operating system 115, a memory 120, a storage 130, input devices 135 and output devices 140 such as a computer display or monitor displaying for example a computer desktop system. Each of modules and equipment such as cloud determination module or movement generation module and other modules discussed herein may be or include, or may be executed by, a computing device such as included in FIG. 5, although various units among these modules may be combined into one computing device.

Operating system 115 may be or may include code to perform tasks involving coordination, scheduling, arbitration, or managing operation of computing device 100, for example, scheduling execution of programs. Memory 120 may be or may include, for example, a Random Access Memory (RAM), a read only memory (ROM), a Flash memory, a volatile or non-volatile memory, or other suitable memory units or storage units. Memory 120 may be or may include a plurality of different memory units. Memory 120 may store for example, instructions (e.g., code 125) to carry out a method as disclosed herein, and/or data such as low-level action data, output data, etc.

Executable code 125 may be any application, program, process, task or script. Executable code 125 may be executed by controller 105 possibly under control of operating system 115. For example, executable code 125 may be one or more modules performing methods as disclosed herein. In some embodiments, more than one computing device 100 or components of device 100 may be used. One or more processor(s) 105 may be configured to carry out embodiments of the present disclosure by for example executing software or code. Storage 130 may be or may include, for example, a hard disk drive, a floppy disk drive, a Compact Disk (CD) drive, a universal serial bus (USB) device or other suitable removable and/or fixed storage unit. Data described herein may be stored in a storage 130 and may be loaded from storage 130 into a memory 120 where it may be processed by controller 105.

Input devices 135 may be or may include a mouse, a keyboard, a touch screen or pad or any suitable input device or combination of devices. Output devices 140 may include one or more displays, speakers and/or any other suitable output devices or combination of output devices. Any applicable input/output (I/O) devices may be connected to computing device 100, for example, a wired or wireless network interface card (NIC), a modem, printer, a universal serial bus (USB) device or external hard drive may be included in input devices 135 and/or output devices 140.

Embodiments of the disclosure may include one or more article(s) (e.g., memory 120 or storage 130) such as a computer or processor non-transitory readable medium, or a computer or processor non-transitory storage medium, such as for example a memory, a disk drive, or a USB flash memory, encoding, including or storing instructions, e.g., computer-executable instructions, which, when executed by a processor or controller, carry out methods disclosed herein.

While illustrative embodiments of the disclosure have been described in detail herein, it is to be understood that the inventive concepts may be otherwise variously embodied and employed, and that the appended claims are intended to be constructed to include such variations, except as limited by the prior art. It should be appreciated that inventive concepts cover any embodiment in combination with any one or more other embodiments, any one or more of the features disclosed herein, any one or more of the features as substantially disclosed herein, any one or more of the features disclosed herein, any one or more of the features as substantially disclosed herein in combination with any one or more features as substantially disclosed herein, any one of the aspects/features/embodiments in combination with any one or more other aspects/features/embodiments, use of any one or more of the embodiments or features as disclosed herein. It is also to be appreciated that any feature described herein can be claimed in combination with any other feature(s) as described herein, regardless of whether the features come from the same described embodiment.

What is claimed is:

1. A system for heat dissipation comprising:
a memory; and
a processor configured to:
    receive one or more images of at least a portion of the sky;
    determine, based at least in part on the one or more images of at least a portion of the sky, one or more aim portions of the sky comprising three-dimensional coordinates;
    employ artificial intelligence to determine:
        one or more portions in the one or more images of the at least a portion of the sky where the sky is cloudless or thinly clouded; and one or more portions in the one or more images of the at least a portion of the sky that require a minimum of movement from one or more heat dissipation surfaces different from the one or more portions where the sky is cloudless or thinly clouded;

determine the one or more aim portions of the sky that correspond to the one or more portions in the one or more images that require a minimum of movement from the one or more heat dissipation surfaces; and controlling the one or more heat dissipation surfaces to be moved in three-dimensional space based on the determination, such that heat is radiated toward the one or more aim portions of the sky.

2. The system of claim 1, wherein the system for heat dissipation further comprises a camera, wherein the camera is configured to capture one or more images of the sky, the one or more images of the sky being received by the processor.

3. The system of claim 1, wherein a robotic arm is configured to tilt and turn the one or more heat dissipation surfaces.

4. The system of claim 1, wherein the processor is further configured to determine whether to perform radiative cooling using the one or more heat dissipation surfaces, to perform active liquid cooling using a cooling tower, or to perform a combination of radiative cooling and active liquid cooling using the one or more heat dissipation surfaces and the cooling tower, respectively.

5. The system of claim 1, wherein the one or more heat dissipation surfaces comprise one or more passive cooling panels configured to emit electromagnetic energy and to cool liquid flowing through the one or more passive cooling panels.

6. The system of claim 1, wherein the one or more heat dissipation surfaces are configured to cool liquid that is circulated through a heat-producing component to cool the heat-producing component.

7. A method for heat dissipation comprising:

receiving, at a computer processor, one or more images of at least a portion of the sky;

determining, by the computer processor, if there exists one or more aim portions of the sky, based in part on the one or more images of at least a portion of the sky comprising three-dimensional coordinates;

using artificial intelligence to determine:

one or more portions in the one or more images of the at least a portion of the sky where the sky is cloudless or thinly clouded; and one or more portions in the one or more images of the at least a portion of the sky that require a minimum of movement from one or more heat dissipation surfaces different from the one or more portions where the sky is cloudless or thinly clouded;

determining the one or more aim portions of the sky that correspond to the one or more portions in the one or more images that require a minimum of movement from the one or more heat dissipation surfaces; and based on the one or more aim portions of the sky, controlling, by the computer processor, the one or more heat dissipation surfaces to be moved in three-dimensional space based on the determination, such that heat is radiated toward the one or more aim portions of the sky.

8. The method of claim 7, wherein a robotic arm is configured to tilt and turn the one or more heat dissipation surfaces.

9. The method of claim 7, the method further comprising determining whether to perform radiative cooling using the one or more heat dissipation surfaces, to perform active liquid cooling using a cooling tower, or to perform a combination of radiative cooling and active liquid cooling using the one or more heat dissipation surfaces and the cooling tower, respectively.

10. The method of claim 7, wherein the one or more heat dissipation surfaces comprises one or more passive cooling panels configured to emit electromagnetic energy and to cool liquid flowing through the one or more passive cooling panels.

11. The method of claim 7, wherein the one or more heat dissipation surfaces are configured to cool liquid that is circulating through a heat-producing component to cool the heat-producing component.

12. A system for heat dissipation comprising:

a memory; and a processor configured to:

receive at least one visual representation of at least a portion of sky;

determine, based on the at least one visual representation of the at least a portion of sky, a mask distinguishing between clouded and cloudless portions of the sky;

employ artificial intelligence to determine:

one or more portions in the determined mask of the visual representation where the sky is cloudless or thinly clouded; and one or more portions in the mask of the visual representation that require a minimum of movement from one or more heat dissipation surfaces different from the one or more portions where the sky is cloudless or thinly clouded;

determine the one or more aim portions of the sky that correspond to the one or more portions in the mask of the visual representation that require a minimum of movement from the one or more heat dissipation surfaces;

and controlling the one or more heat dissipation panels to move in three-dimensional space based on the determination to point toward the one or more aim portions of the sky, if there exists the one or more aim portions of the sky.

13. The system of claim 12, wherein the determination of a direction is used to move one or more actuators moving the one or more heat dissipation panels.

14. The system of claim 12, wherein the mask is determined using a neural network.

15. The system of claim 12, wherein the processor is configured to determine whether to perform radiative cooling using the one or more heat dissipation panels, to perform active liquid cooling using a cooling tower, or to perform a combination of radiative cooling and active liquid cooling using a combination of the one or more heat dissipation panels and the cooling tower, respectively.

16. The system of claim 15, the system further comprising a valve configured to selectively direct cooling fluid to one or more of the one or more heat dissipation panels and a cooling tower.

17. The system of claim 12, wherein the one or more heat dissipation panels comprise one or more passive cooling panels configured to emit electromagnetic energy and to cool fluid flowing through the one or more passive cooling panels.

18. The system of claim 12, wherein the one or more heat dissipation panels are configured to cool liquid that is circulating through a heat-producing component to cool the heat-producing component.

\* \* \* \* \*